United States Patent
Suwa et al.

(10) Patent No.: US 9,990,981 B2
(45) Date of Patent: Jun. 5, 2018

(54) SYNCHRONOUS DYNAMIC RANDOM ACCESS MEMORY (SDRAM) AND MEMORY CONTROLLER DEVICE MOUNTED IN SINGLE SYSTEM IN PACKAGE (SIP)

(71) Applicant: Renesas Electronics Corporation, Tokyo (JP)

(72) Inventors: Motoo Suwa, Tokyo (JP); Takafumi Betsui, Tokyo (JP)

(73) Assignee: Renesas Electronics Corporation, Koutou-ku, Tokyo (JP)

( * ) Notice: Subject to any disclaimer, the term of this patent is extended or adjusted under 35 U.S.C. 154(b) by 0 days. days.

(21) Appl. No.: 15/178,091

(22) Filed: Jun. 9, 2016

(65) Prior Publication Data
US 2017/0032832 A1  Feb. 2, 2017

(30) Foreign Application Priority Data
Jul. 29, 2015 (JP) ................................ 2015-149726

(51) Int. Cl.
*G11C 11/4076* (2006.01)
*H01L 23/498* (2006.01)
(Continued)

(52) U.S. Cl.
CPC .......... *G11C 11/4076* (2013.01); *G11C 5/063* (2013.01); *H01L 23/498* (2013.01);
(Continued)

(58) Field of Classification Search
CPC .................................................. G11C 11/4076
(Continued)

(56) References Cited

U.S. PATENT DOCUMENTS 5,838,603 A * 11/1998 Mori ...................... G11C 5/025
365/230.03
6,038,132 A *  3/2000 Tokunaga ............. H01L 25/105
257/E25.023
(Continued)

FOREIGN PATENT DOCUMENTS

| JP | 2007-213375 A | 8/2007 |
| JP | 2009-223854 A | 10/2009 |
| JP | 2010-123203 A | 6/2010 |

OTHER PUBLICATIONS

JEDEC Standard DDR2 SDRAM Specification JESD79-2F, JEDEC Solid State Technology Association, Nov. 2009.*
(Continued)

*Primary Examiner* — Anthan Tran
*Assistant Examiner* — Mushfique Siddique
(74) *Attorney, Agent, or Firm* — Sughrue Mion, PLLC

(57) ABSTRACT

To provide an electronic device capable of improving a signal quality, the electronic device includes a semiconductor memory device, a semiconductor device configured to access data stored in the semiconductor memory device, and a wiring substrate on which the semiconductor memory device and the semiconductor device are mounted. The wiring substrate includes first and second data wirings electrically connecting the semiconductor device with each first and second data terminal of the semiconductor memory device through first and second wiring layers. The first wiring layer is a wiring layer arranged closer to the semiconductor device than the second wiring layer, and the first data terminal is located farther from the semiconductor device than the second data terminal.

3 Claims, 13 Drawing Sheets

(51) Int. Cl.
  *H01L 27/108* (2006.01)
  *H01L 23/538* (2006.01)
  *G11C 5/06* (2006.01)
(52) U.S. Cl.
  CPC .. *H01L 23/49816* (2013.01); *H01L 23/49827* (2013.01); *H01L 23/49844* (2013.01); *H01L 23/5381* (2013.01); *H01L 23/5383* (2013.01); *H01L 27/108* (2013.01); *H01L 2224/16227* (2013.01); *H01L 2224/16235* (2013.01); *H01L 2924/15192* (2013.01); *H01L 2924/15311* (2013.01)
(58) Field of Classification Search
  USPC .......................................................... 365/51
  See application file for complete search history.

(56) References Cited

U.S. PATENT DOCUMENTS

| | | | | |
|---|---|---|---|---|
| 6,212,113 B1* | 4/2001 | Maeda | G11C 7/1066 | 365/201 |
| 6,335,901 B1* | 1/2002 | Morita | G11C 7/1045 | 365/194 |
| 7,023,719 B1* | 4/2006 | Hung | G11C 5/04 | 365/226 |
| 7,123,497 B2* | 10/2006 | Matsui | G11C 5/00 | 365/51 |
| 7,529,112 B2* | 5/2009 | Dreps | G11C 5/04 | 365/51 |
| 7,532,537 B2* | 5/2009 | Solomon | G06F 12/0207 | 365/230.06 |
| 7,729,151 B2* | 6/2010 | Tsern | G11C 5/02 | 365/189.2 |
| 7,916,574 B1* | 3/2011 | Solomon | G11C 5/04 | 365/149 |
| 8,081,537 B1* | 12/2011 | Bhakta | G06F 12/0207 | 365/149 |
| 8,670,261 B2* | 3/2014 | Crisp | G11C 5/06 | 365/51 |
| 8,930,647 B1* | 1/2015 | Smith | G06F 9/44557 | 711/103 |
| 9,170,744 B1* | 10/2015 | Smith | G06F 9/3814 | |
| 9,171,585 B2* | 10/2015 | Rajan | G11C 7/10 | |
| 9,324,397 B1* | 4/2016 | Desai | G11C 7/22 | |
| 9,390,766 B2* | 7/2016 | Yoshikawa | G11C 5/063 | |
| 2004/0084538 A1* | 5/2004 | Nishizawa | G06K 19/07732 | 235/492 |
| 2004/0196682 A1* | 10/2004 | Funaba | H01L 23/552 | 365/149 |
| 2004/0257847 A1* | 12/2004 | Matsui | G11C 5/00 | 365/63 |
| 2005/0174878 A1* | 8/2005 | Osaka | G11C 7/1051 | 365/233.1 |
| 2005/0258532 A1* | 11/2005 | Yoshikawa | H01L 23/49838 | 257/698 |
| 2006/0192282 A1* | 8/2006 | Suwa | H01L 23/50 | 257/723 |
| 2006/0264022 A1* | 11/2006 | Sugimura | H01L 21/563 | 438/613 |
| 2006/0265543 A1* | 11/2006 | Oeschay | G06F 12/0676 | 711/5 |
| 2007/0192559 A1* | 8/2007 | Betsui | G11C 5/04 | 711/167 |
| 2007/0194433 A1* | 8/2007 | Suwa | H01L 23/49838 | 257/700 |
| 2007/0228436 A1* | 10/2007 | Ruckerbauer | H01L 25/105 | 257/296 |
| 2007/0291557 A1* | 12/2007 | Nishio | G11C 5/02 | 365/193 |
| 2008/0006947 A1* | 1/2008 | Akiba | G11C 5/02 | 257/778 |
| 2008/0012107 A1* | 1/2008 | Isa | H01L 23/49838 | 257/678 |
| 2008/0080261 A1* | 4/2008 | Shaeffer | G11C 5/025 | 365/189.05 |
| 2008/0094811 A1* | 4/2008 | Hazelzet | G11C 5/04 | 361/760 |
| 2008/0116572 A1* | 5/2008 | Baek | G11C 5/025 | 257/734 |
| 2008/0237848 A1* | 10/2008 | Yoshikawa | G11C 5/02 | 257/723 |
| 2008/0316696 A1* | 12/2008 | Nishiyama | H01L 24/49 | 361/679.31 |
| 2009/0085223 A1* | 4/2009 | Nishiyama | H01L 23/3121 | 257/777 |
| 2009/0108470 A1* | 4/2009 | Okada | H01L 24/48 | 257/777 |
| 2009/0161401 A1* | 6/2009 | Bilger | G11C 5/02 | 365/51 |
| 2009/0237129 A1* | 9/2009 | Hayashi | H05K 1/181 | 327/142 |
| 2009/0321960 A1* | 12/2009 | Okumura | H01L 23/49838 | 257/777 |
| 2010/0034045 A1* | 2/2010 | Sato | G11C 7/1006 | 365/236 |
| 2011/0069523 A1* | 3/2011 | Kuroda | G11C 7/1006 | 365/63 |
| 2011/0211411 A1* | 9/2011 | Ide | G11C 5/025 | 365/219 |
| 2011/0317475 A1* | 12/2011 | Suwa | G11C 5/04 | 365/149 |
| 2012/0206954 A1* | 8/2012 | Yoshikawa | G11C 5/063 | 365/63 |
| 2012/0261837 A1* | 10/2012 | Inoue | H01L 23/49838 | 257/777 |
| 2013/0314968 A1* | 11/2013 | Shaeffer | G11C 5/04 | 365/51 |
| 2014/0097547 A1* | 4/2014 | Kuroda | H01L 25/0657 | 257/777 |
| 2014/0115199 A1* | 4/2014 | Yoshikawa | G06F 13/4068 | 710/51 |
| 2014/0192583 A1* | 7/2014 | Rajan | G11C 7/10 | 365/63 |
| 2014/0325105 A1* | 10/2014 | Prete | G06F 13/1642 | 710/112 |
| 2014/0362629 A1* | 12/2014 | Crisp | G11C 5/025 | 365/51 |
| 2015/0043298 A1* | 2/2015 | Hayashi | G11C 5/063 | 365/233.1 |
| 2015/0089183 A1* | 3/2015 | Bains | G06F 12/06 | 711/202 |
| 2015/0115472 A1* | 4/2015 | Crisp | H01L 23/12 | 257/777 |
| 2015/0143037 A1* | 5/2015 | Smith | G06F 3/061 | 711/103 |
| 2015/0234758 A1* | 8/2015 | Yoshikawa | G06F 13/287 | 710/308 |
| 2015/0327367 A1* | 11/2015 | Shen | H01L 23/5381 | 361/767 |
| 2015/0355846 A1* | 12/2015 | Uematsu | G11C 5/04 | 711/103 |
| 2016/0012865 A1* | 1/2016 | Lee | H01L 25/0655 | 365/51 |
| 2016/0049176 A1* | 2/2016 | Lee | G11C 5/025 | 365/51 |
| 2016/0079206 A1* | 3/2016 | Cho | H01L 25/0657 | 257/737 |
| 2016/0092383 A1* | 3/2016 | Bains | G06F 13/1678 | 710/308 |
| 2016/0093339 A1* | 3/2016 | Crisp | G11C 5/02 | 365/51 |
| 2016/0093340 A1* | 3/2016 | Sun | H01L 24/00 | 365/51 |
| 2016/0126187 A1* | 5/2016 | Inaba | H01L 23/49844 | 257/329 |
| 2016/0181214 A1* | 6/2016 | Oh | H01L 45/04 | 257/777 |

(56) References Cited

U.S. PATENT DOCUMENTS

2017/0053846 A1* 2/2017 Katsura .................. H01L 23/18
2017/0287826 A1* 10/2017 Guo ................. H01L 23/49827
2017/0352678 A1* 12/2017 Lu ....................... H01L 21/4846

OTHER PUBLICATIONS

JEDEC Standard, "Low Power Double Data Rate 4 (LPDDR4)", JESD209-4, Aug. 2014, JEDEC Solid State Technology Association, 196 pgs.

* cited by examiner

FIG. 3

| | 1 | 2 | 3 | 4 | 5 | 8 | 9 | 10 | 11 | 12 |
|---|---|---|---|---|---|---|---|---|---|---|
| A | | | | | | | | | | |
| B | | DQ0_A | | DQ7_A | | | DQ15_A | | DQ8_A | |
| C | | DQ1_A | DMI0_A | DQ6_A | | | DQ14_A | DMI1_A | DQ9_A | |
| D | | | DQS0_t_A | | | | | DQS1_t_A | | |
| E | | DQ2_A | DQS0_c_A | DQ5_A | | | DQ13_A | DQS1_c_A | DQ10_A | |
| F | | DQ3_A | | DQ4_A | | | DQ12_A | | DQ11_A | |
| G | | | | | | | | | | |
| H | | CA0_A | CS1_A | CS0_A | | | CA2_A | CA3_A | CA4_A | |
| J | | CA1_A | | CKE0_A | CKE1_A | CK_t_A | CK_c_A | | CA5_A | |
| K | | | | | CS2_A | CKE2_A | | | | |
| N | | | | | CS2_B | CKE2_B | | | | |
| P | | CA1_B | | CKE0_B | CKE1_B | CK_t_B | CK_c_B | | CA5_B | |
| R | | CA0_B | CS1_B | CS0_B | | | CA2_B | CA3_B | CA4_B | |
| T | | | | | | | | | | |
| U | | DQ3_B | | DQ4_B | | | DQ12_B | | DQ11_B | |
| V | | DQ2_B | DQS0_c_B | DQ5_B | | | DQ13_B | DQS1_c_B | DQ10_B | |
| W | | | DQS0_t_B | | | | | DQS1_t_B | | |
| Y | | DQ1_B | DMI0_B | DQ6_B | | | DQ14_B | DMI1_B | DQ9_B | |
| AA | | DQ0_B | | DQ7_B | | | DQ15_B | | DQ8_B | |
| AB | | | | | | | | | | |

SYNCHRONOUS DYNAMIC RANDOM ACCESS MEMORY (SDRAM) AND MEMORY CONTROLLER DEVICE MOUNTED IN SINGLE SYSTEM IN PACKAGE (SIP)

CROSS-REFERENCE TO RELATED APPLICATION

The present application claims priority from Japanese Patent Application No. 2015-149726 filed on Jul. 29, 2015, the content of which is hereby incorporated by reference into this application.

TECHNICAL FIELD OF THE INVENTION

The present invention relates to an electronic device, and for example, to an electronic device in which a memory device such as a low power double data rate 4 (LPDDR4)-synchronous dynamic random access memory (SDRAM), and a controller device of the memory device are mounted in a single system in package (SiP).

BACKGROUND OF THE INVENTION

For example, Japanese Patent Application Laid-Open Publication No. 2007-213375 (Patent Document 1), No. 2009-223854 (Patent Document 2), and No. 2010-123203 (Patent Document 3) describe configurations in which a memory device, and a controller device which accesses the memory device are mounted on a wiring substrate. In Patent Document 1, the memory device and the controller device are connected with each other in wiring layers L1 and L2 of the wiring substrate. In Patent Documents 2 and 3, the memory device and the controller device are connected in wiring layers L1, L3 and L6 of the wiring substrate. JEDEC Standard JESD209-4 (Non Patent Document 1) defines the LPDDR4 standard.

SUMMARY OF THE INVENTION

For example, as described in Patent Documents 1 to 3, in a conventional electronic device, the memory device and the controller device communicate with each other through a device mounting surface of the wiring substrate (the wiring layer L1). This method makes it easier to draw out a wiring from the controller device by assigning an outermost external electrode of the controller device for use in a signal, for example. However, in such a method, when, for example, the electronic device has a memory device such as an LPDDR4 which performs data communication in synchronization with both edges of a high-speed clock signal such as a signal of 0.8 to 1.6 GHz, crosstalk between wirings increases, which may make it difficult to achieve desired signal quality.

Embodiments described below have been made in view of the foregoing and the above and other preferred aims and novel characteristics of the present invention will be apparent from the description of the present specification and the accompanying drawings.

According to an embodiment of the present invention, an electronic device includes a semiconductor memory device, a semiconductor device configured to access data stored in the semiconductor memory device, and a wiring substrate on which the semiconductor memory device and the semiconductor device are mounted. The wiring substrate includes first and second data wirings electrically connecting the semiconductor device with each first and second data terminal of the semiconductor memory device through first and second wiring layers. The first wiring layer is a wiring layer arranged closer to the semiconductor device than the second wiring layer, and the first data terminal is located farther from the semiconductor device than the second data terminal.

According to the embodiment, it is possible to improve a signal quality in the electronic device.

BRIEF DESCRIPTIONS OF THE DRAWINGS

FIG. 3 is a plan view illustrating an example of a schematic arrangement configuration of the external terminals in the memory device of FIG. 2.

FIG. 7A is a plan view illustrating a configuration example of a wiring layer L2, and FIG. 7B is a plan view illustrating a configuration example of a wiring layer L4.

DESCRIPTIONS OF THE PREFERRED EMBODIMENTS

The following embodiment will be described being divided into a plurality of embodiments or sections for convenience sake if necessary, but unless expressly stated otherwise, these embodiments or sections are not independent from one another, where one thereof is in a relationship with a modification example, details, a supplementary explanation, or the like of a portion or entirety of the other. Also, in the embodiments described below, when referring to the number of elements (including number of pieces, values, amount, range, etc.), the number of the elements is not limited to a specific number unless otherwise stated or except the case where the number is apparently limited to a specific number in principle. The number larger or smaller than the specified number is also applicable.

Further, in the embodiments described below, it goes without saying that the components (including element steps) are not always indispensable unless otherwise stated or except the case where the components are apparently indispensable in principle. Similarly, in the embodiments described below, when the shape of the components, positional relation thereof, and the like are mentioned, the substantially approximate and similar shapes and the like are included therein unless otherwise stated or except the case where it is conceivable that they are apparently excluded in principle. The same goes for the numerical value and the range described above.

A circuit element configuring each functional block of the embodiment is not particularly limited, and is formed on a semiconductor substrate such as a monocrystalline silicon, by an integrated circuit technology of a known CMOS (complementary MOS transistor) and the like.

Hereinafter, embodiments of the present invention will be explained in detail with reference to the accompanying drawings. In the entire diagrams for explaining the embodiments of the present invention, the same or a related symbol is attached to the member which has the same function, and the repeated explanation thereof is omitted.

First Embodiment

<<Schematic Configuration of Electronic Device>>

Figure 1A:
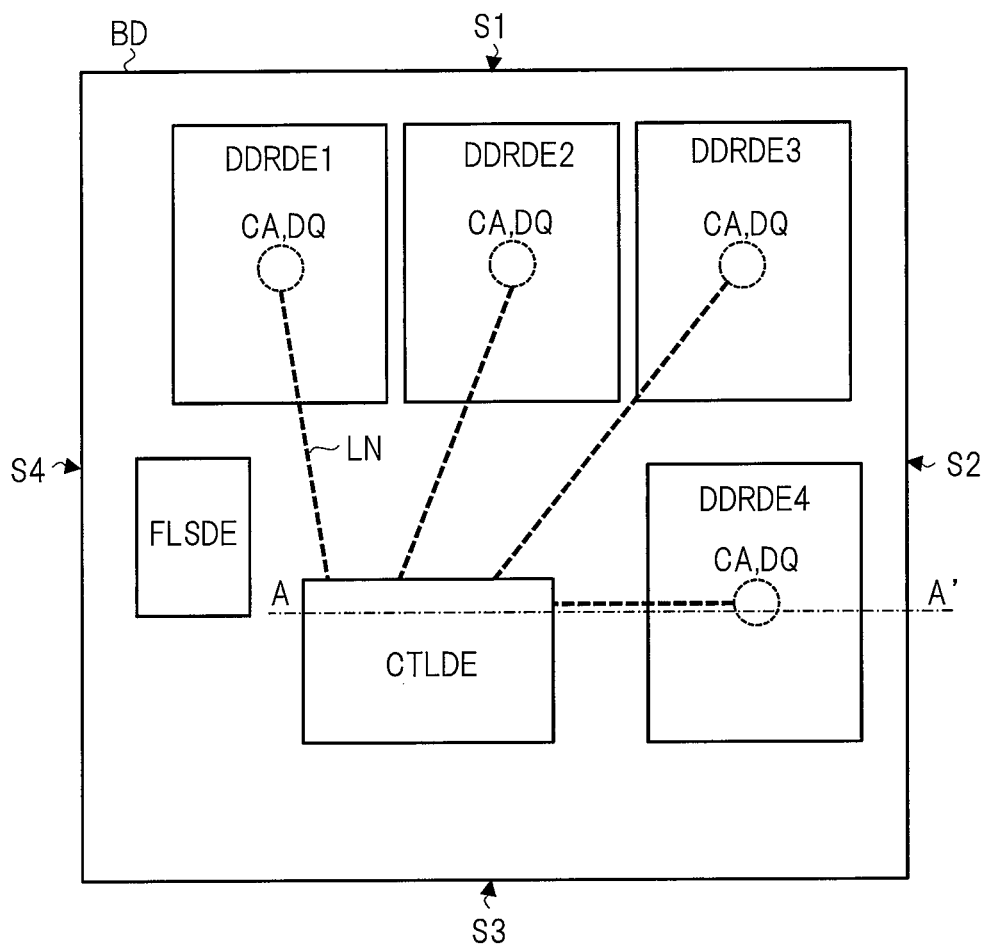
FIG. 1A is a plan view illustrating a schematic configuration example of an outer shape of an electronic device according to a first embodiment of the present invention.
Figure 1B:
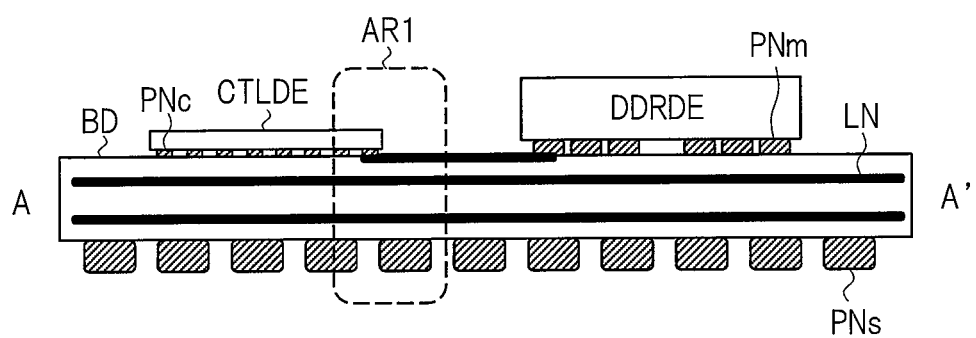
FIG. 1B is a cross-sectional view illustrating a schematic structural example of the electronic device between A to A' in FIG. 1A.

FIG. 1A is a plan view illustrating a schematic configuration example of an outer shape of the electronic device according to a first embodiment of the present invention. FIG. 1B is a cross-sectional view illustrating a schematic structural example of the electronic device between A to A' in FIG. 1A. The electronic device illustrated in FIGS. 1A and 1B has a plurality of (four in this example) memory devices (semiconductor memory devices) DDRDE1 to DDRDE4, a controller device (a semiconductor device) CTLDE, and a wiring substrate BD on which the plurality of the memory devices and the controller device are mounted. In this example, a flash memory device FLSDE is also mounted on the wiring substrate BD.

The wiring substrate BD has a shape of an approximate square defined by a side S1, a side S2 intersecting with the side S1, and a side S3 and a side S4 respectively opposing the side S1 and the side S2. Each side of the wiring substrate BD is approximately 4 cm long, but not limited thereto. In the example, the memory devices DDRDE1, DDRDE2, and DDRDE3 are arranged in order along the side S1, in such a way that a short side of each of the memory devices DDRDE1, DDRDE2, and DDRDE3 is parallel to the side S1.

The memory device DDRDE4 is arranged side by side with the memory device DDRDE3 along the side S2. The memory devices DDRDE3 and DDRDE4 are arranged in such a way that a long side of each of the memory devices DDRDE3 and DDRDE4 is parallel to the side S2. The controller device CTLDE is arranged side by side with the memory device DDRDE4 along the side S3. The controller device CTLDE is also arranged side by side with the memory device DDRDE1 or DDRDE2 along the side S4. The controller device CTLDE is arranged in such a way that a long side thereof is parallel to the sides S1 and S3.

Each of the plurality of the memory devices DDRDE1 to DDRDE4 is configured as a package such as a ball grid array (BGA), having a plurality of external terminals PNm. An LPDDR4 memory chip (a semiconductor chip) or the like is mounted on each package, and the plurality of the external terminals PNm are used as the external terminals of the memory chip. The controller device CTLDE is configured as, for example, a single semiconductor chip having a plurality of external terminals PNc. A circuit which provides access to the plurality of the memory devices DDRDE1 to DDRDE4, a circuit which provides access to the flash memory device FLSDE, and the like are formed on the semiconductor chip.

The wiring substrate BD has a plurality of wiring layers. In the wiring substrate BD, the external terminal PNc of the controller device CTLDE which is flip-chip bonded onto a surface of the wiring substrate BD is connected with the external terminal PNm of the plurality of the memory devices DDRDE1 to DDRDE4 which are mounted on a surface of the wiring substrate BD by means of a wiring LN in each wiring layer, in an appropriate manner. The wiring LN includes a control wiring to transmit a command to access data to the memory device, and a data wiring to transfer write-data and read-data according to the command. In the case of the LPDDR4, the control wiring is typically a command address (CA) signal wiring, and the data wiring is typically a DQ signal wiring.

The wiring substrate BD is packaged including the plurality of the memory devices DDRDE1 to DDRDE4 and the controller device CTLDE. A plurality of external terminals PNs as the package (the BGA package, for example) are provided on the undersurface of the wiring substrate BD. As described above, the electronic device illustrated in FIGS. 1A and 1B is configured as a system in package (SiP), i.e., as a single package in which a plurality of semiconductor memory devices and a semiconductor device are mounted. The external terminal PNs of the SiP is connected to a motherboard which is not illustrated, for example.

<<Schematic Configuration of Memory Device>>

Figure 2:
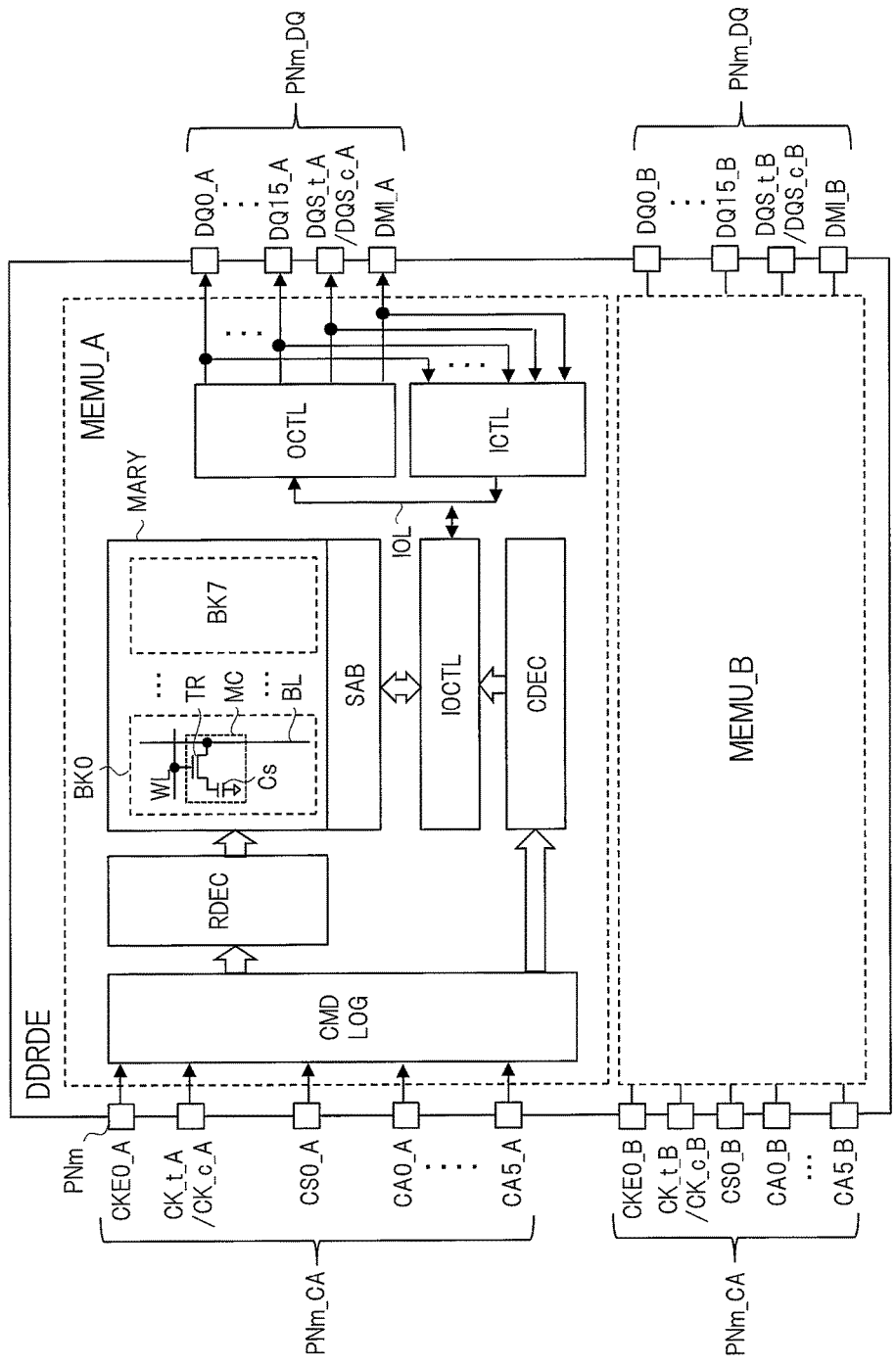
FIG. 2 is a circuit block diagram illustrating a schematic configuration example of main components of each memory device in the electronic device of FIGS. 1A and 1B.

FIG. 2 is a circuit block diagram illustrating a schematic configuration example of main components of each memory device in the electronic device of FIGS. 1A and 1B. FIG. 2 illustrates a configuration example of one memory chip (that is, rank 1) included in each of the plurality of the memory devices DDRDE1 to DDRDE4 illustrated in FIG. 1A. The memory device DDRDE illustrated in FIG. 2 includes a memory unit MEMU_A which forms a channel A, and a memory unit MEMU_B which forms a channel B.

The memory device DDRDE has a plurality of external terminals PNm corresponding to the memory unit MEMU_A. The plurality of the external terminals PNm are mainly divided into control terminals PNm_CA and data terminals PNm_DQ. The control terminals PNm_CA include a CKE0_A terminal, a CK_t_A/CK_c_A terminal, a CS0_A terminal, and CA0_A to CA5_A terminals. The data terminals PNm_DQ include DQ0_A to DQ15_A terminals, a DQS_t_A/DQS_c_A terminal, and a DMI_A terminal.

In the present specification, a CKE0_A terminal (or signal) is called a clock enable (CKE) terminal (signal), and a CK_t_A/CK_c_A terminal (signal) is called a clock (CK) terminal (signal), as generic terms. Also, a CS0_A terminal (signal) is called a chip select (CS) terminal (signal), and CA0_A to CA5_A terminals (signals) are each called a command address (CA) terminal (signal). Further, DQ0_A to DQ15_A terminals (signals) are each called a DQ terminal (signal), a DQS_t_A/DQS_c_A terminal (signal) is called a data strobe (DQS) terminal (signal), and a DMI_A terminal (signal) is called a data mask inversion (DMI) terminal (signal).

Next, an internal configuration of the memory unit MEMU_A will be described. A memory array MARY includes, for example, eight memory banks BK0 to BK7. Each memory bank includes a plurality of word lines WL, a plurality of bit lines BL, and a memory cell MC arranged at each intersection of the plurality of the word lines WL and the plurality of the bit lines BL. The memory cell MC includes a memory cell transistor TR and a memory capacitance Cs. When a specified word line WL is activated, the memory cell transistor TR, as a write operation, writes the data of the bit line BL to the memory capacitance Cs, and, as a read-out operation, reads out the date of the memory capacitance Cs to the bit line BL.

The command logic circuit CMDLOG receives the CS0_A signal and the CA0_A to CA5_A signals in synchronization with the CK_t_A/CK_c_A signal, as the main operation, when the CKE0_A signal is enabled. The command logic circuit CMDLOG interprets various commands such as a write or a read command (that is, a command to access data) to a specified bank address and a specified memory address based on the logic level combination of the received signals.

A row decoder circuit RDEC receives a bank address and a row address interpreted by the command logic circuit CMDLOG, and activates the specified word line WL of a specified bank. A sense amplifier circuit SAB amplifies data which is read out to a plurality of bit lines BL of the specified bank. A column decoder circuit CDEC receives a column address interpreted by the command logic circuit CMDLOG, and outputs a selection signal accordingly. An input/output control circuit IOCTL determines a sense amplifier circuit SAB to be connected to an IO line IOL based on the selection signal from the column decoder circuit CDEC.

An output control circuit OCTL outputs data of the IO line IOL at a double data rate (DDR), in a read-out operation. At this time, the output control circuit OCTL outputs a DQS_t_A/DQS_c_A signal and a DMI_A signal which is based on a mode register setting. An input control circuit ICTL fetches data having been received by the DQ0_A to DQ15_A terminals in synchronization with the DQS_t_A/DQS_c_A signal received by the external terminal PNm, and outputs the data to the IO line IOL at a DDR, in a write operation. At this time, the input control circuit ICTL inverts the received data in some cases, based on the DMI_A signal received by the external terminal PNm, and outputs the inverted data to the IO line IOL. The DQS terminal and the DMI terminal are each provided to the DQ terminal of 1 byte actually, not the DQ terminal of 2 bytes.

The memory unit MEMU_B has a similar configuration to the memory unit MEMU_A described above. In brief, the memory device DDRDE has control terminals PNm_CA and data terminals PNm_DQ corresponding to the memory unit MEMU_B. The control terminals PNm_CA include a CKE0_B terminal, a CK_t_B/CK_c_B terminal, a CS0_B terminal, and CA0_B to CA5_B terminals. The data terminals PNm_DQ include DQ0_B to DQ15_B terminals, a DQS_t_B/DQS_c_B terminal, and a DMI_B terminal. The memory unit MEMU_B writes data and reads out data to the memory array in the memory unit MEMU_B, based on a command (a command to access data) received by the CS0_B terminal and the CA0_B to CA5_B terminals.

FIG. 3 is a plan view illustrating an example of a schematic arrangement configuration of the external terminals in the memory device of FIG. 2. The arrangement configuration is determined based on the JEDEC standard of LPDDR4. In FIG. 3, the external terminals PNm corresponding to the memory unit MEMU_A described above are provided in the upper half area, and the external terminals PNm corresponding to the memory unit MEMU_B described above are provided in the lower half area.

The upper half area is further divided into a right half area and a left half area. The DQ terminals of 1 byte, and the differential (two) DQS terminals and a single (one) DMI terminal corresponding to the 1 byte are arranged in each of the right and left areas. Likewise, the lower half area is also divided into a right half area and a left half area. The DQ terminals of 1 byte, and the differential (two) DQS terminals and a single (one) DMI terminal corresponding to the 1 byte are arranged in each of the right and left areas.

A CS1_A terminal, a CS1_B terminal, a CKE1_A terminal, and a CKE1_B terminal illustrated in FIG. 3 are terminals for a rank 2 configuration. That is, the rank 2 configuration in which two memory chips (memory chip as illustrated in FIG. 2) are mounted in a package may actually be applied to the memory device DDRDE illustrated in FIG. 2. In this case, a CS1_A signal, a CS1_B signal, a CKE1_A signal and a CKE1_B signal are used in the memory chip corresponding to the rank 2, and the other signals are commonly used in the rank 1 and rank 2. In blank terminals of FIG. 3, external terminals PNm for a power supply voltage (VDD1, VDD2, VDDQ) and a ground power-supply voltage GND, external terminals PNm for a rank 3 and a rank 4 configuration, and the like are arranged in an appropriate manner, although not illustrated.

<<Schematic Configuration of Controller Device>>

Figure 4:
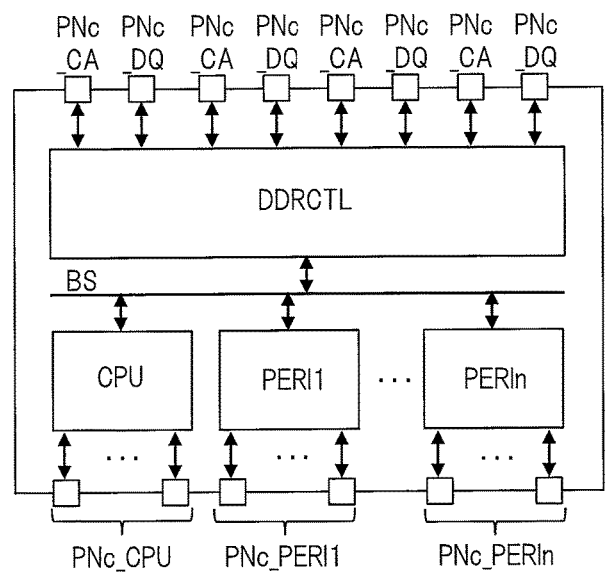
FIG. 4 is a circuit block diagram illustrating a schematic configuration example of main components of the controller device in the electronic device of FIGS. 1A and 1B.

FIG. 4 is a circuit block diagram illustrating a schematic configuration example of main components of the controller device in the electronic device of FIGS. 1A and 1B. The controller device CTLDE illustrated in FIG. 4 is, for example, a System on a Chip (SoC) including a single semiconductor chip, and has a plurality of external terminals PNc, a DDR controller circuit DDRCTL, an central processing circuit CPU, and various peripheral circuits PERI1 to PERIn. These circuits are connected with each other through a bus BS.

The plurality of the external terminals PNc include an external terminal PNc_CPU for the central processing circuit CPU, external terminals PNc_PERI1 to PNc_PERIn for the various peripheral circuits PERI1 to PERIn, and four pairs of a control terminal PNc_CA and a data terminal PNc_DQ. The central processing circuit CPU performs specified central processing, while accessing the plurality of the memory devices DDRDE illustrated in FIG. 1A by way of the DDR controller circuit DDRCTL. At this time, the DDR controller circuit DDRCTL accesses each of the four memory devices DDRDE1 to DDRDE4 by way of the four pairs of the control terminal PNc_CA and the data terminal PNc_DQ, while converting a command from the central processing circuit CPU into a command based on the LPDDR4 or the like.

The various peripheral circuits PERI1 to PERIn include a controller circuit which controls access to the flash memory device FLSDE, a controller circuit which performs serial communication, and a controller circuit which controls output of audio and an image, although not particularly limited. The central processing circuit CPU and all or some of the various peripheral circuits PERI1 to PERIn communicate with the motherboard and so on by way of the external terminal PNs. The configuration of the controller device CTLDE is not necessarily limited to the SoC described above, provided that the controller device CTLDE has a DDR controller circuit DDRCTL, and a control terminal PNc_CA and a data terminal PNc_DQ, at least.

<<Structure of Wiring Substrate>>

Figure 5:
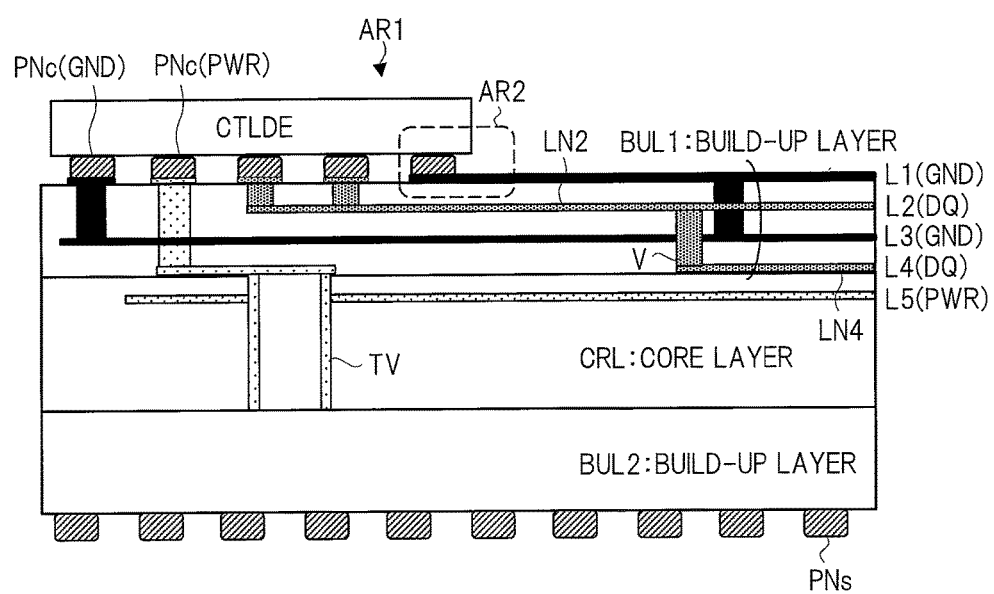
FIG. 5 is a cross-sectional view illustrating a detailed example of a structure around the controller device (an area AR1) in the wiring substrate of FIG. 1B.

FIG. 5 is a cross-sectional view illustrating a detailed example of a structure around the controller device (an area AR1) in the wiring substrate of FIG. 1B. The wiring substrate BD illustrated in FIG. 5 has a core layer CRL, and build-up layers BUL1 and BUL2 respectively formed on each side of the core layer CRL. Each of the build-up layers BUL1 and BUL2 is constituted of three insulation layers, for example. The core layer CRL is constituted of four insulation layers, for example. Accordingly, the build-up layer BUL1 has three wiring layers L1 to L3. The insulation layer is made of an epoxy resin, polyimide, and the like, and the wiring layer is made of copper and the like, although there is no specific limitation on the material of the layers.

All signal wirings to electrically connect the controller device CTLDE with the memory device DDRDE are provided in the top layer of the build-up layer BUL1 and the core layer CRL. The controller device CTLDE and the memory device DDRDE (not illustrated in FIG. 5) are mounted on part of the wiring layer (a power-supply wiring layer) L1. Almost all area of the wiring layer L1, that is, the area from which the mounting area of the above-described devices is excluded is a ground plane to which a ground power-supply voltage GND is supplied.

All the signal wirings (that is, the control wiring and the data wiring) between the controller device CTLDE and the memory device DDRDE are provided in the wiring layers L2 and L4. Among the signal wirings, the data wiring (typically the DQ signal wiring) is mainly divided into the data wiring which electrically connects the devices through the wiring layer L2 (a wiring LN2 in FIG. 5), and the data wiring which electrically connects the devices through the wiring layer L4 (a wiring LN4 in FIG. 5). The latter data wiring (wiring LN4) includes a wiring which uses the wiring LN2 only in a partial section. Such wiring LN2 is connected to the wiring LN4 by way of a via V. In this case, however, the data wiring in the wiring layer L4 (the wiring LN4) is used in the most section (85% or more, for example) between the devices. The former data wiring (the wiring LN2) is, in other words, a wiring not through the wiring layer L4.

A wiring layer (a power-supply wiring layer) L3 is, as is the case with the wiring layer L1, a ground plane to which, in almost all area thereof, a ground power-supply voltage GND is supplied. A wiring layer (a power-supply wiring layer) L5 located inside the core layer CRL is a power plane to which, in almost all area thereof, a power supply voltage PWR is supplied. The power plane is connected to the controller device CTLDE and the memory device DDRDE by way of the via V to supply a power supply for the controller device CTLDE, an IO power supply for the memory device DDRDE, and so on. The power plane is also connected to a build-up layer BUL2 by way of a through via TV, and connected to an external terminal PNs by way of the build-up layer BUL2.

As described above, the structure illustrated in FIG. 5 is a strip line structure in which a signal wiring is arranged between ground planes, or between a ground plane and a power plane. That is, the wiring layer L2 is arranged between two wiring layers (power-supply wiring layers) L1 and L3, both of which are ground planes, and the wiring layer L4 is arranged between the wiring layer (the power-supply wiring layer) L3 which is a ground plane and the wiring layer L5 which is a power plane.

With this strip line structure, crosstalk between wirings is reduced, and thus signal quality is improved, as compared to a case in which a microstrip line structure is used, as described in Patent Documents 2 and 3. In addition, since all the signal wirings connecting the controller device CTLDE and the memory device DDRDE with each other are provided in the build-up layer BUL1, signal quality is also improved. That is, the controller device CTLDE and the memory device DDRDE communicate with each other, without particularly using the through via TV in the core layer CRL, which can be a factor of reduction in signal quality.

As described above, signal quality is improved by using the structure in FIG. 5. In fact, however, there is a discrepancy between ideal and real strip line structures due to various factors, and this may cause reduction in signal quality. Presence of a return current is one of the factors. For example, in FIG. 5, when a DQ signal is output from the controller device CTLDE by way of the wiring LN2, a resultant return current flows back to the external terminal PNc (GND) for the ground power-supply voltage GND of the controller device CTLDE by way of the wiring layers L1 and L3. Likewise, when a DQ signal is output from the controller device CTLDE by way of the wiring LN4, a resultant return current flows back to the external terminal PNc (GND), and the external terminal PNc (PWR) for the power supply voltage PWR of the controller device CTLDE, by way of the wiring layers L3 and L5.

For example, in the case of FIG. 1A, the memory devices DDRDE1 to DDRDE4 are provided, and accordingly, DQ signals of 128 bits (16 bytes) are provided. At the same time, a return current of 128 bits flows back to the controller device CTLDE. The return current of 128 bits flows in the reverse direction to the path of the corresponding DQ signal. As a result, the return current flows back to the controller device CTLDE from various directions in a wide range. Since the return current flows back to the controller device CTLDE in a wide range, crosstalk between wirings may increase, when the return current flows back to the controller device CTLDE by taking a circuitous path, or when the return current is not absorbed sufficiently by the controller device CTLDE. For this reason, it is useful to employ a configuration illustrated in FIGS. 6A and 6B.

Figure 6A:
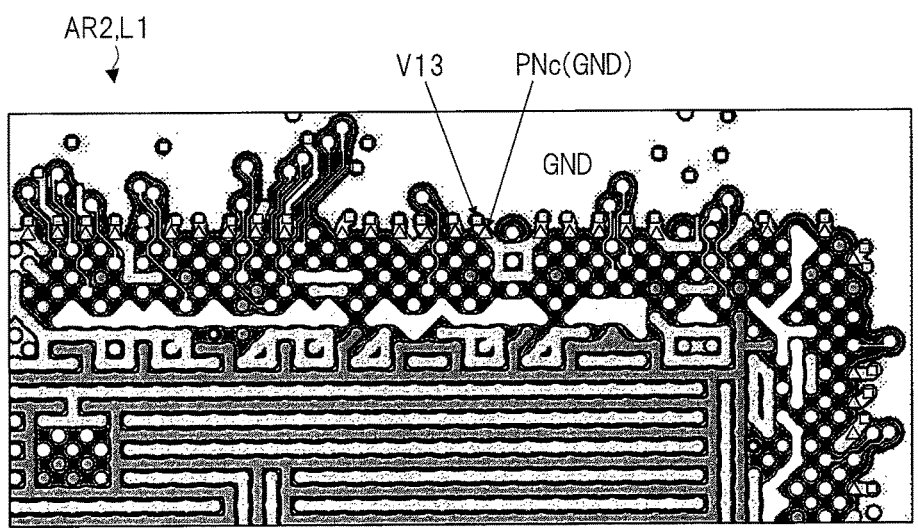
FIG. 6A is a plan view illustrating a layout configuration example of a wiring layer L1 around the controller device (an area AR2) of FIG. 5.
Figure 6B:
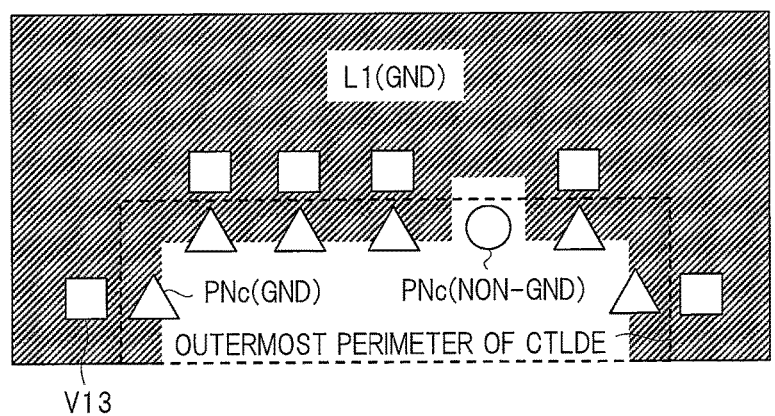
FIG. 6B is a pattern diagram in which the configuration in FIG. 6A is simplified.

FIG. 6A is a plan view illustrating a layout configuration example of the wiring layer L1 around the controller device (an area AR2) of FIG. 5. FIG. 6B is a pattern diagram in which the configuration in FIG. 6A is simplified. The controller device CTLDE has a plurality of external terminals (bumps) PNc arranged in a grid pattern. Accordingly, the wiring layer L1 also has grid-like bump patterns, as illustrated in FIG. 6A. In the controller device CTLDE, most of the external terminals (for example, a half or more, desirably 70% or more) arranged on the outermost perimeter of the controller device CTLDE are the external terminals PNc (GND) for the ground power-supply voltage GND.

With this configuration, the external terminal PNc (GND) is electrically connected to the ground plane (L1 (GND)) provided in the wiring layer L1, by way of a corresponding bump pattern, as illustrated in FIGS. 6A and 6B. As described above, most of the external terminals arranged on the outermost perimeter of the controller device CTLDE are the external terminals PNc (GND) for the ground power-supply voltage GND, and thus a boundary of the ground plane (L1 (GND)) is extended to the inside of the mounting area of the controller device CTLDE. Moreover, the controller device CTLDE and the ground plane (L1 (GND)) of the wiring layer L1 can be connected with each other directly with a wide connecting width.

Further in this configuration, as illustrated in FIGS. 6A and 6B, a via V13 is provided in the immediate vicinity of each bump pattern, which corresponds to the external terminal PNc (GND) on the outermost perimeter. The via V13 electrically connects the wiring layer L1 with the wiring layer L3. The distance between the bump pattern (PNc (GND)) and the via V13 is equal to or less than twice the diameter of the via, for example. With this configuration, the controller device CTLDE and the ground plane (L3 (GND)) of the wiring layer L3 can be connected with each other with a wide connecting width.

As a result, the return current can sufficiently flow back to the controller device CTLDE, without concentrating on a specific part (in other words, without taking a circuitous path). That is, most of the return current due to charge/discharge currents of DQ signals flow through the ground plane (L1 (GND), L3 (GND)) of the respective wiring layers L1 and L3. With the configuration illustrated in FIGS. 6A and 6B, the return current which flows through the wiring layers L1 and L3 are absorbed sufficiently by the controller device CTLDE due to a low ground impedance, without concentrating on a specific part.

Consequently, crosstalk is reduced, which provides a further improvement in signal quality, in addition to an advantageous effect by the strip line structure described above. If a range in which the return current can flow back is narrow, and the resultant return current concentrates on a specific part, the specific part then becomes a common current path, which can be a factor of increase in crosstalk.

As described above, through the electronic device according to the first embodiment, improvement in signal quality in particular is achieved.

Second Embodiment

<<Structure of Wiring Substrate (Application Example [1])>>

Figure 7A:
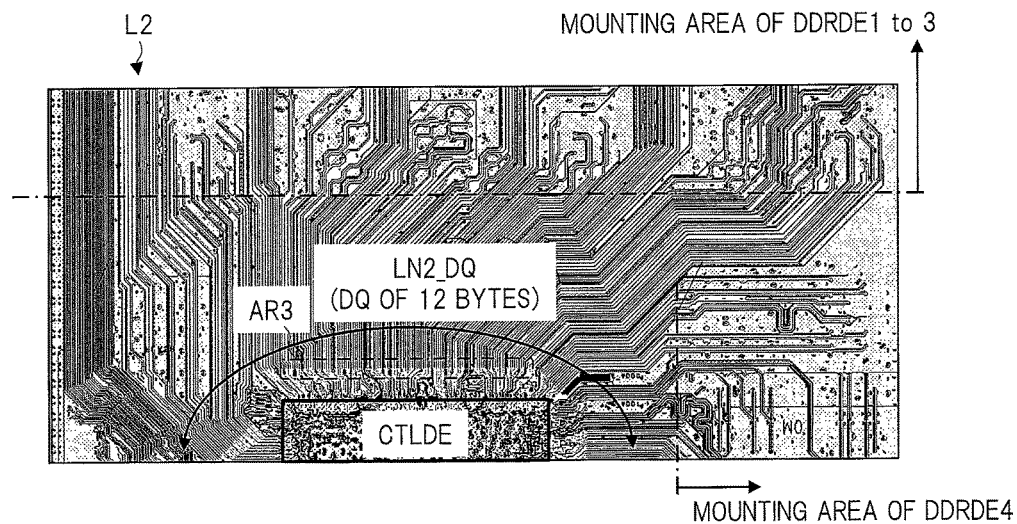
FIGS. 7A and 7B illustrate a configuration example of main components of the wiring substrate of FIGS. 1A and 1B, in an electronic device according to a second embodiment of the present invention.
Figure 7B:
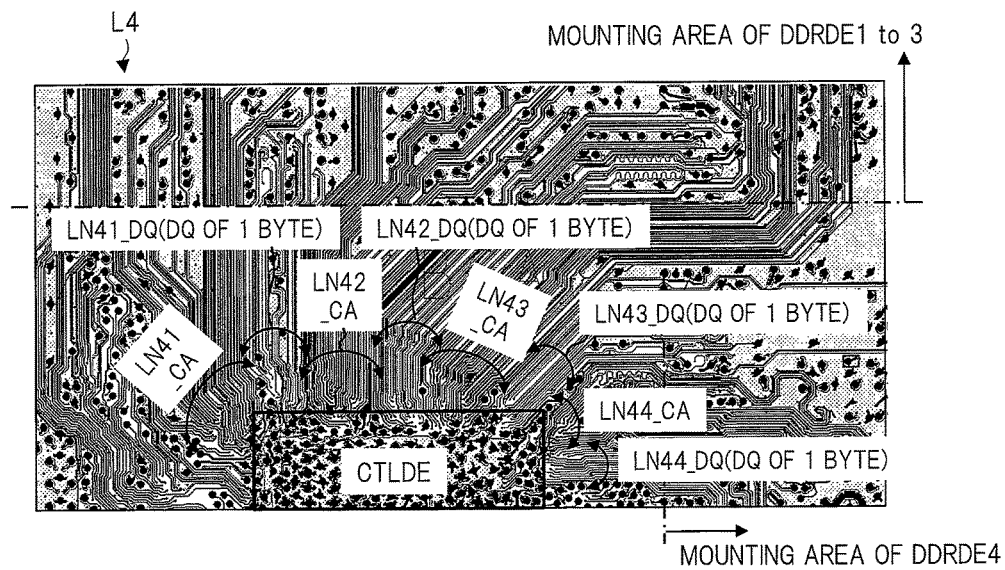

FIGS. 7A and 7B illustrate a configuration example of main components of the wiring substrate of FIGS. 1A and 1B, in an electronic device according to a second embodiment of the present invention. FIGS. 7A and 7B are plan views illustrating configuration examples of wiring layers L2 and L4, respectively. As illustrated in FIG. 7A, the wiring layer L2 has a data wiring LN2_DQ including a DQ signal wiring of 12 bytes. As illustrated in FIG. 7B, the wiring layer L4 has data wirings LN41_DQ to LN44_DQ including DQ signal wirings of 4 bytes in total, and control wirings LN41_CA to LN44_CA, each of which is connected to a control terminal PNm_CA (FIG. 2) of each memory device DDRDE1 to DDRDE4.

In the above-described structural example illustrated in FIG. 5, the wiring layer (the power-supply wiring layer) L5 is the power plane (L5 (PWR)) to which the power supply voltage PWR is supplied. Also, as described above, when a DQ signal is transferred through a wiring LN4, a return current flows through the wiring layers L3 and L5. The return current passing through the wiring layer L5 flows back to an external terminal PNc (PWR) for the power supply voltage PWR in a controller device CTLDE. Generally, the number of the external terminals PNc (PWR) is smaller than the number of external terminals PNc (GND) for ground power-supply voltage s GND. As a result, concentration of return current occur easily, when the return current flows through the wiring layer L5.

Furthermore, the return current which passes through the wiring layers L3 and L5 flows back to the controller device CTLDE by way of the larger number of vias than the return current which passes through the wiring layers L1 and L3. The via does not have a strip line structure, and, in addition, includes a relatively large inductor component. The via, therefore, may be a factor of the increase in crosstalk. Due to the above, the data wirings LN41_DQ to LN44_DQ of the wiring layer L4 (in other words, the wiring layer far from the controller device CTLDE) is lower in signal quality than the data wiring LN2_DQ of the wiring layer L2 (the wiring layer arranged closer to the controller device CTLDE).

It may be preferable, therefore, that all the data wirings be provided in the wiring layer L2. In such a configuration, however, the wiring density of the wiring layer L2 is too high, while the wiring density of the wiring layer L4 is too low. Specifically, in all the memory devices DDRDE1 to DDRDE4, there are 176 data wirings including, as illustrated in FIGS. 2 and 3, DQ signals of 128 bits, and 12 other data-related signals in total per chip (two DQS signals and one DMI signal in each byte).

In one memory device DDRDE, there are 23 control wirings including, as illustrated in FIGS. 2 and 3, 12 CA signals, 4 CS signals (assuming rank 2 structure), 4 CK signals, 2 CKE signals, and one reset signal which is not illustrated. In all the memory devices DDRDE1 to DDRDE4, therefore, there are 92 control wirings. To arrange the above wirings in the two wiring layers L2 and L4 in a balanced manner, each wiring layer L2 and L4 has preferably 134 wirings ((176+92)/2=134).

As described above, arranging all the data wirings in the wiring layer L2 causes a disparity in wiring density. Moreover, crosstalk between wirings may even increase, due to the increase in wiring density of the wiring layer L2. That is, optimal characteristics are not necessarily obtained by arranging all the data wirings in the wiring layer L2. Based on the above description, it is desirable to divide (arrange) the data wirings as illustrated in FIGS. 7A and 7B, when taking balanced wiring into consideration.

More specifically, the data wiring LN2_DQ of the wiring layer L2 includes, for example, three-quarters (96 bits (12 bytes)) of the DQ signal wiring, and corresponding 36 data-related signal wirings. The data wirings LN41_DQ to LN44_DQ of the wiring layer L4 include, for example, one-quarter (32 bits (4 bytes)) of the DQ signal wiring, and corresponding 12 data-related signal wirings. That is, the control wirings LN41_CA to LN44_CA of the wiring layer L4 include 92 wirings in total. The control wirings, unlike the data wirings, operate at a single data rate (SDR), not a double data rate (DDR). The control wirings thus have a more timing margin than the data wirings, and are not significantly affected by crosstalk. For the above reason, the wiring layer L4 is used for the control wirings.

Figure 8:
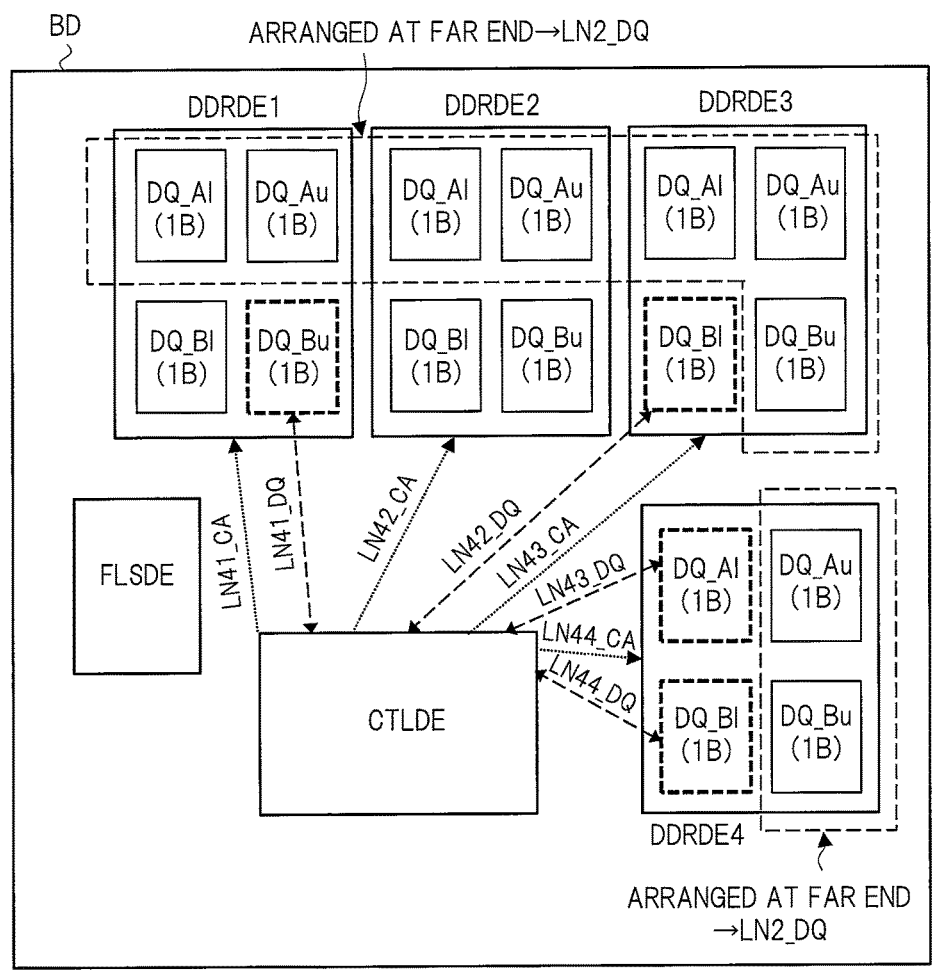
FIG. 8 is a pattern diagram illustrating an example of connection between the controller device and the memory device, in the electronic device through the wiring layer of FIGS. 7A and 7B.
Figure 9:
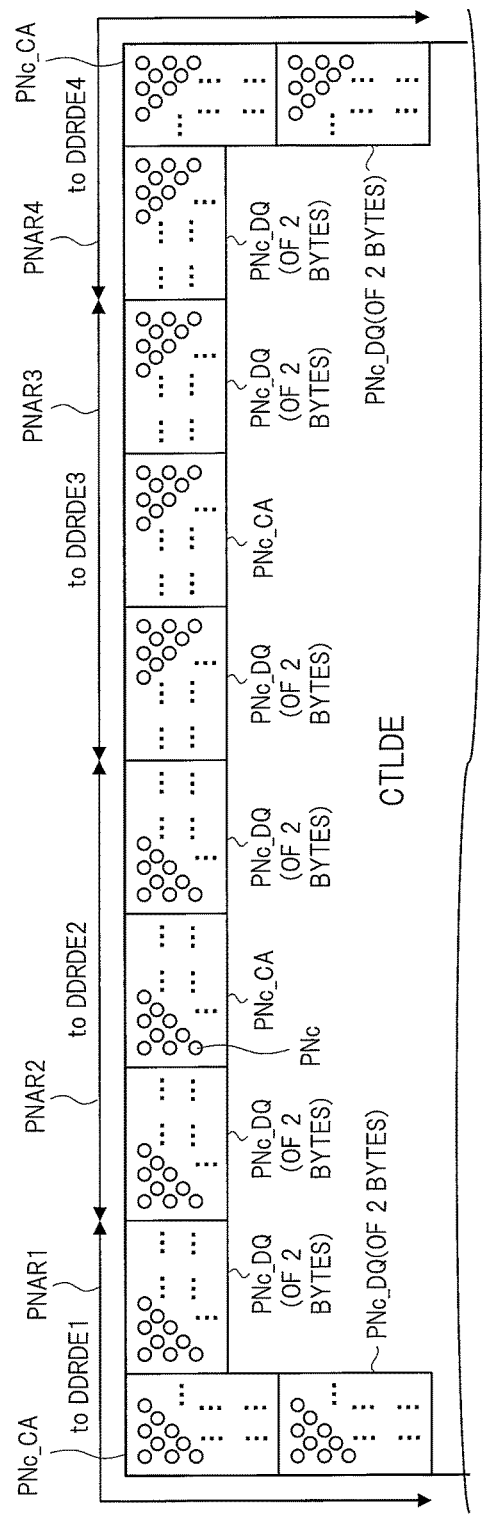
FIG. 9 is a schematic view illustrating an arrangement configuration example of the external terminals in the controller device of FIG. 8.

FIG. 8 is a pattern diagram illustrating an example of connection between the controller device and the memory device, in the electronic device through the wiring layer of FIGS. 7A and 7B. FIG. 9 is a schematic view illustrating an arrangement configuration example of the external terminals in the controller device of FIG. 8. As illustrated in FIG. 9, the controller device CTLDE has external terminal areas PNAR1 to PNAR4, through each of which the controller device CTLDE is electrically connected to the memory devices DDRDE1 to DDRDE4. The external terminal areas PNAR1 to PNAR4 are arranged consecutively in order, along sides of the controller device CTLDE. In this example, the external terminal areas PNAR1 to PNAR4 are arranged over the entire length of one long side (i.e. a side opposing the side S1 in FIG. 1A) of the controller device CTLDE, and also along part of each of two short sides intersecting with the long side (i.e. respective sides opposing the sides S2 and S4 in FIG. 1A).

Each of the external terminal areas PNAR1 to PNAR4 includes three groups of the external terminals, which are consecutively arranged along the side(s) of the controller device CTLDE. Among the three groups of the external terminals, the middle group has the control terminals PNc_CA, and the other two groups arranged on both sides of the middle group have "n/2" data terminals PNc_DQ of "n" data terminals PNc_DQ including DQ signal terminals of 4 bytes. The "n/2" data terminals PNc_DQ include DQ signal terminals of 2 bytes. More precisely, the data terminals PNc_DQ additionally includes a DQS signal terminal and a DMI signal terminal which correspond to the DQ signal terminals of 2 bytes.

In FIG. 8, each memory device DDRDE1 to DDRDE4 has an upper-half external terminal area corresponding to a channel A, and a lower-half external terminal area corresponding to a channel B, as illustrated in FIG. 3. In the upper-half external terminal area, a left-half external terminal area includes data terminals DQ_Al of lower 1 byte, and a right-half external terminal area includes data terminals DQ_Au of upper 1 byte. Likewise, in the lower-half external terminal area, a left-half external terminal area includes data terminals DQ_Bl of lower 1 byte, and a right-half external terminal area includes data terminals DQ_Bu of upper 1 byte.

In this case, the data terminals DQ_Al and DQ_Au of the memory devices DDRDE1 to DDRDE3, the data terminal DQ_Bu of the memory device DDRDE3, and the data terminals DQ_Au and DQ_Bu of the memory device DDRDE4 are relatively far from the controller device CTLDE. On the other hand, the data terminals DQ_Bl and DQ_Bu of the memory devices DDRDE1 and DDRDE2, the data terminal DQ_Bl of the memory device DDRDE3, and the data terminals DQ_Al and DQ_Bl of the memory device DDRDE4 are relatively close to controller device CTLDE.

Generally, signal quality determined by crosstalk and the like decreases, as the distance between the controller device CTLDE and the data terminal mentioned above increases (that is, a wiring length increases). For this reason, the data wiring LN2_DQ of the wiring layer L2 illustrated in FIG. 7A is used as a data wiring between the data terminal PNc_DQ of the controller device CTLDE and each of the above-described far-arranged data terminals of 9 bytes in total, because the data wiring LN2_DQ provides relatively high signal quality. Meanwhile, data terminals of 4 bytes are selected from the above-described close-arranged data terminals of 7 bytes in total. Then, each of the data wirings LN41_DQ to LN44_DQ of the wiring layer L4 illustrated in FIG. 7B is used as a data wiring between the data terminal PNc_DQ of the controller device CTLDE and each of the selected data terminals of 4 bytes.

The data terminals of 4 bytes can be selected based on the convenience of wiring, on condition that the data wirings LN41_DQ to LN44_DQ of 2 bytes are not arranged continuously, but are arranged of 1 byte each separately, with each of the control wirings LN41_CA to LN44_CA interposed therebetween, as illustrated in FIGS. 7B and 8. That is, when a large number of the data wirings of which the operation rate fluctuates rapidly are arranged in a concentrated manner, such data wirings may collectively generate a large crosstalk. Such a large crosstalk is reduced by interposing the control wirings LN41_CA to LN44_CA between the data wirings.

In the example illustrated in FIG. 8, the data terminal DQ_Bu of the memory device DDRDE1, the data terminal DQ_Bl of the memory device DDRDE3, and the data terminals DQ_Al and DQ_Bl of the memory device DDRDE4 are selected as the data terminals of 4 bytes. In the data terminals of remaining 3 bytes after excluding the data terminals of 4 bytes from the close-arranged data terminals of 7 bytes, the data wiring LN2_DQ of the wiring layer L2 illustrated in FIG. 7A is used. It is useful to employ the arrangement configuration of the controller device CTLDE illustrated in FIG. 9, so as to facilitate the arrangement of the control wirings and the data wirings illustrated in FIGS. 7B and 8.

Figure 10:
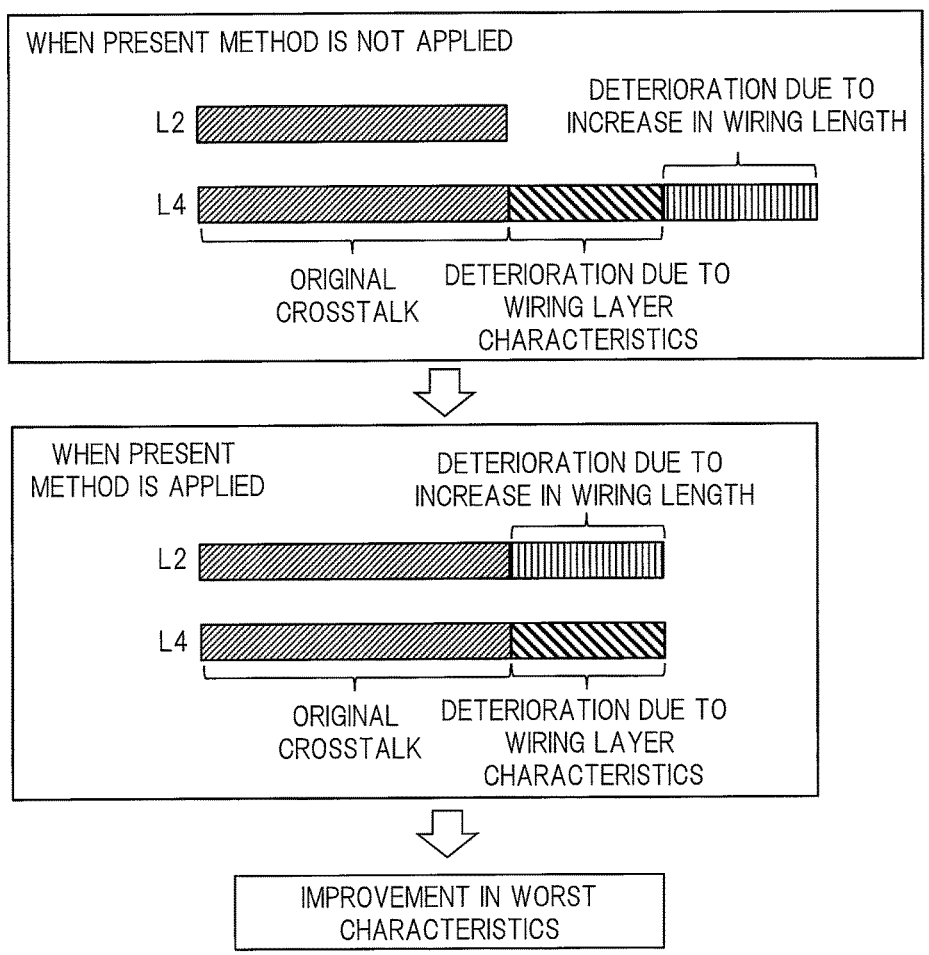
FIG. 10 is an explanatory diagram illustrating an example of effect in a case of using the configuration of FIG. 8.

FIG. 10 is an explanatory diagram illustrating an example of effect in a case of using the configuration of FIG. 8. When the method of the second embodiment is not applied, the worst value of crosstalk increases due to deterioration of the wiring layer L4, as illustrated in FIG. 10. For example, assuming that the data wirings of the far-arranged data terminals in FIG. 8 (e.g. the data terminal DQ_Al in the memory device DDRDE1) are arranged in the wiring layer L4, the amount of crosstalk of the data wirings in the wiring layer L4 includes not only a component generated due to the structure independently of the location of the wiring layer, but also includes an additional amount depending on the location of the wiring layer (L2 or L4), and furthermore, an additional amount due to the increase in wiring length (close or far). As a result, the worst value of crosstalk of the entire wiring substrate BD increases.

When the method of the second embodiment is applied, the amount of crosstalk of the data wiring LN2_DQ in the wiring layer L2 includes a component generated due to the structure of the wiring layers, and an additional amount due to the increase in wiring length. Further, the amount of crosstalk of the data wirings LN41_DQ to LN44_DQ in the wiring layer L4 includes a component generated due to the structure of the wiring layers, and an additional amount depending on the location of the wiring layer. As a result, the worst value of crosstalk of the entire wiring substrate BD can be reduced, in comparison with the case in which the method of the second embodiment is not applied. As the signal quality of the entire wiring substrate BD is determined by the worst value, the signal quality is increased by applying the method of the second embodiment.

Consequently, signal quality is particularly increased through the electronic device according to the second embodiment. Moreover, signal quality is further increased through the methods of the first and second embodiments together in combination. That is, most of the external terminals PNc arranged on the outermost perimeter in the external terminal areas PNAR1 to PNAR4 of the controller device CTLDE illustrated in FIG. 9 are set as the terminals for the ground power-supply voltage GND, as illustrated in FIGS. 6A and 6B.

Third Embodiment

<<Structure of Wiring Substrate (Application Example [2])>>

Figure 11A:
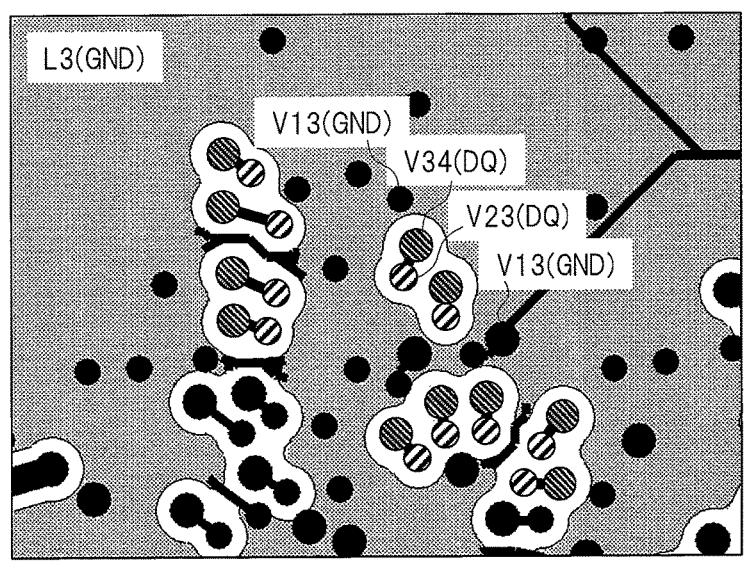
FIG. 11A is a plan view illustrating a configuration example of main components of a wiring layer L3 in the wiring substrate of FIGS. 1A and 1B, in an electronic device according to a third embodiment of the present invention.
Figure 11B:
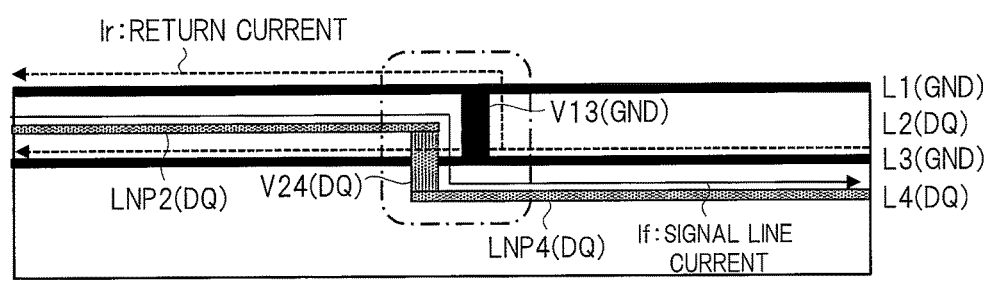
FIG. 11B is a cross-sectional view illustrating an example of effect of FIG. 11A.

FIG. 11A is a plan view illustrating a configuration example of main components of a wiring layer L3 in the wiring substrate of FIGS. 1A and 1B, in an electronic device according to a third embodiment of the present invention, and FIG. 11B is a cross-sectional view illustrating an example of effect of FIG. 11A. As illustrated in FIG. 11B, some of a plurality of data wirings through a wiring layer L4 include a data wiring (a partial wiring) LNP2(DQ) extending in the wiring layer L2, a data wiring (a partial wiring) LNP4(DQ) extending in the wiring layer L4, and a via V24(DQ) which electrically connects the data wiring LNP2(DQ) with the data wiring LNP4(DQ).

Specifically, for example, a data terminal PNc_DQ of a controller device CTLDE is transferred to the data wiring LNP4(DQ) by way of the via V24(DQ) after drawing out the data terminal PNc_DQ to the data wiring LNP2(DQ). In this case, as in the description of the first embodiment, the data wiring LNP4(DQ) is used in most section between the controller device CTLDE and the memory device DDRDE.

In FIG. 11B, when, for example, a signal line current If according to a DQ signal from the controller device CTLDE flows through the data wiring LNP2(DQ) to the via V24(DQ), in response, a return current Ir flows to the wiring layer L1, L3 (that is, the ground plane) in the cross-sectional direction so as to overlap the path of the signal line current If. Likewise, when the signal line current If, which is input by way of the via V24(DQ), flows through the data wiring LNP4(DQ), in response, a return current Ir flows to the wiring layer L3 (more specifically, also to a wiring layer L5 as well).

As a result, when the signal line current If flows through the data wiring LNP4(DQ) by way of the via V24(DQ), the return current (an electron current, for example) Ir flowing through the wiring layer L1 loses the way, causing an eddy current. This actually prevents the return current Ir flowing through the wiring layer L1 from flowing back to the controller device CTLDE sufficiently. In addition, such eddy current affects other signals, generating noise.

Since the return current Ir flowing through the wiring layer L3 has continuity, the return current Ir can flow back to the controller device CTLDE by way of the via V13 illustrated in FIGS. 6A and 6B. In the configuration illustrated in FIGS. 6A and 6B, the wiring layer L1 has a lower impedance than the wiring layer L3. It is therefore important to enable the return current Ir flowing through the wiring layer L1 to flow back to the controller device CTLDE sufficiently.

As a solution, a via V13(GND) to electrically connect the wiring layer L1 with the wiring layer L3 is provided in proximity to the via V24(DQ), as illustrated in FIG. 11B. With this configuration, the return current Ir flowing through the wiring layer L1 has continuity, so that this prevents an eddy current, and enables the return current Ir to flow back to the controller device CTLDE sufficiently. As a result, the signal quality improves.

In the example illustrated in FIG. 11A, the via V24(DQ) in FIG. 11B corresponds to a via V23(DQ) connecting the wiring layer L2 and the wiring layer L3 with each other, and a via V34(DQ) connecting the wiring layer L3 and the wiring layer L4 with each other. In the wiring layer L3, the via V23(DQ) and the via V34(DQ) are arranged in a land provided on the ground plane, and the via V13(GND) is arranged in the immediate vicinity of the land. The distance between the via V13(GND) and the via V24(DQ) (the via V23(DQ) or V34(DQ)) is equal to or less than four times the diameter of the via, for example. A diameter of the via land is 100 μm, and a minimum width of the wiring is 25 μm, although not particularly limited to such figures.

As described above, through the electronic device according to the third embodiment, improvement in signal quality in particular can be achieved. In view of providing the via V13(GND) described above, the arrangement configuration illustrated in FIGS. 7B and 8 is advantageous. That is, the data wirings LN41_DQ to LN44_DQ are not arranged densely, but are arranged each separately, with each of the control wirings LN41_CA to LN44_CA interposed therebetween. Such arrangement makes it easier to secure a space for the via V13(GND).

Fourth Embodiment

<<Improvement in Timing Margin>>

Figure 12A:
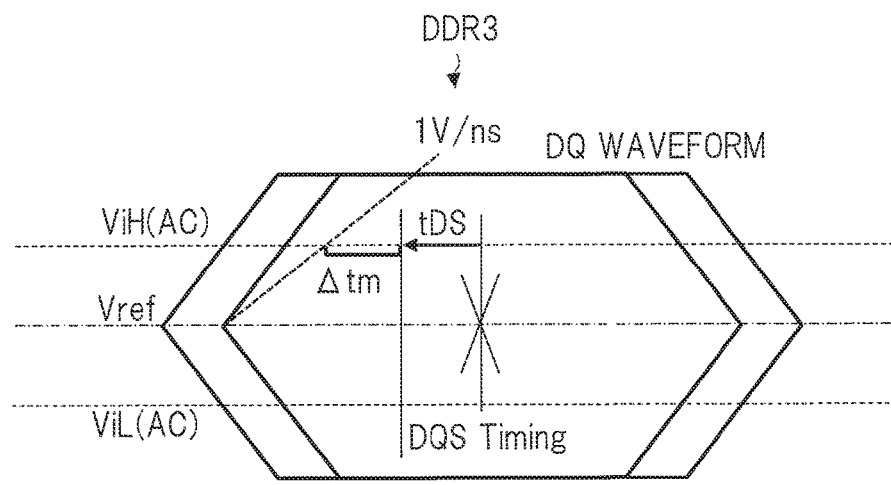
FIG. 12A is a waveform chart illustrating a timing specification for DDR3 and the like based on the standard of JEDEC, and FIG. 12B a waveform chart illustrating a timing for LPDDR4, in comparison to FIG. 12A.

In LPDDR4, a slew rate of a receiving-end waveform directly affects a timing margin. It is therefore important to control the timing margin. FIG. 12A is a waveform chart illustrating a timing specification for DDR3 and the like based on the standard of JEDEC, and FIG. 12B a waveform chart illustrating a timing for the LPDDR4, in comparison to FIG. 12A. Since slew rate derating is specified for the DDR3, a timing margin does not increase even if the slew rate is increased. In FIG. 12A, therefore, as long as the slew rate is higher than a reference slew rate (e.g. 1 V/ns), an increase in the slew rate is not a significant problem.

Figure 12B:
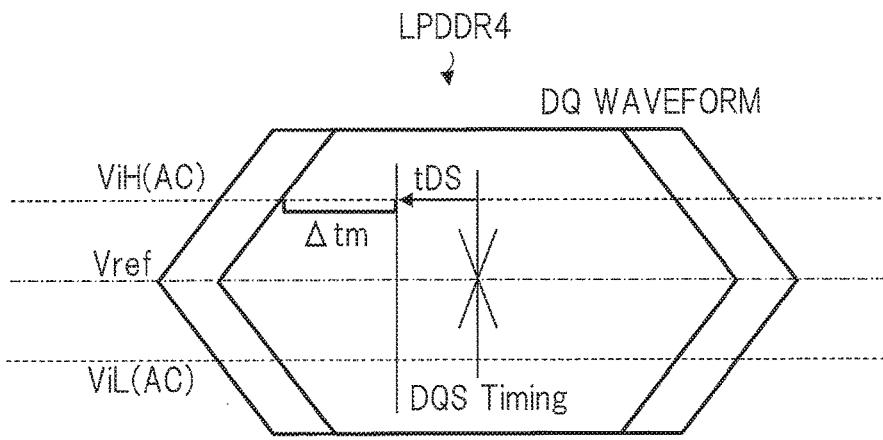

On the other hand, slew rate derating is not specified for the LPDDR4. In such a case, as illustrated in FIG. 12B, the timing margin Δtm is determined depending on the time when a DQ signal waveform reaches a ViH/ViL level. Thus the timing margin Δtm increases as the slew rate increases, if jitter and the like are constant. It is, therefore, advantageous for the electronic device using the LPDDR4 to increase the slew rate as much as possible.

The inventors of the present invention found out that the slew rate depends not only on a driving capability of a driver, but also on an impedance of a data wiring connecting the controller device CTLDE and the memory device DDRDE with each other. Generally, impedance matching is recommended so that the impedance of the data wiring can be the same as the driving impedance and a terminal resistance of a driver. In the actual electronic device, however, a receiving-end device has parasitic capacitance due to a protection element and the like. The charge and discharge time of the parasitic capacitance depends approximately on "Z0×Ct", where Z0 denotes a wiring impedance, and Ct denotes a receiving-end capacitance. It is therefore important to reduce the wiring impedance.

<<Structure of Wiring Substrate (Application Example [3])>>

Figure 13:
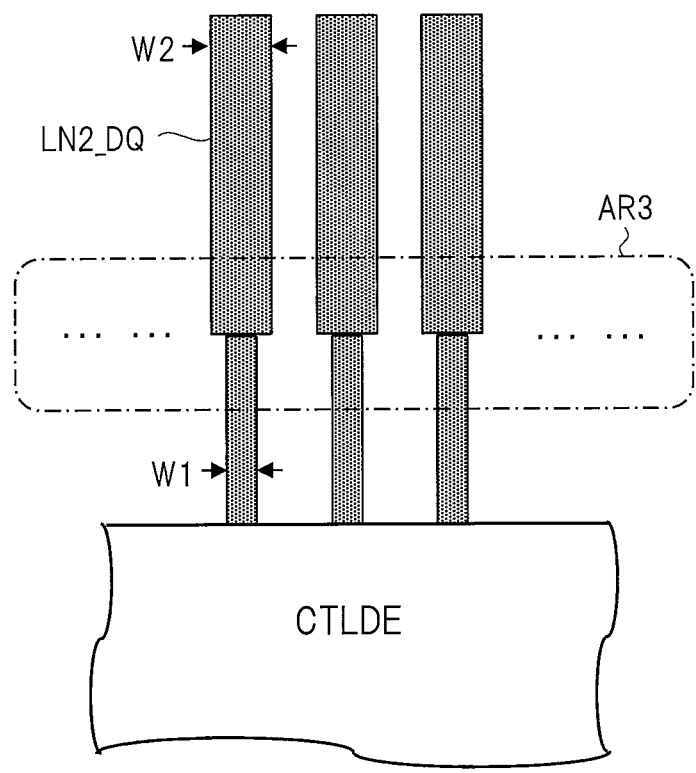
FIG. 13 is a plan view illustrating a schematic configuration example of main components of a wiring layer L2 in a wiring substrate, in an electronic device according to a fourth embodiment of the present invention.

FIG. 13 is a plan view illustrating a schematic configuration example of main components of the wiring layer L2 in a wiring substrate, in an electronic device according to a fourth embodiment of the present invention. As illustrated in FIG. 13, a data wiring LN2_DQ of the wiring layer L2 is formed with a wiring width W1 in the vicinity of the controller device CTLDE. In other than the vicinity thereof, the data wiring LN2_DQ is formed with a wiring width W2 wider than the wiring width W1. An area AR3 in FIG. 13 corresponds to the area AR3 in FIG. 7A.

Through the study results including the above-described impedance matching, a wiring impedance (a characteristic impedance) between the controller device CTLDE and the memory device DDRDE is desirably set to be lower than the driving impedance and the terminal resistance of a driver, by approximately 20% or less. Based on the above description, as illustrated in FIG. 13, the data wiring LN2_DQ is formed in the minimum manufacturing size (the wiring width W1=25 μm, for example) in an area close to the controller device CTLDE, in other words, the area where the wiring density is high. Meanwhile, the data wiring LN2_DQ is formed so as to have the wiring width W2 of 50 μm, for example, in the vicinity of the memory device DDRDE. When the wiring width W2 of 50 μm is employed, the wiring impedance is 37Ω, whereas the driving impedance and the terminal resistance of a driver are both 40Ω.

As described above, through the electronic device according to the fourth embodiment, timing margin can be increased, and as a result, signal quality can be improved. Although the data wiring of the wiring layer L2 has been described as an example, it is desirable that the embodiment be also applied to the data wiring of the wiring layer L4.

Fifth Embodiment

<<Schematic Configuration of Electronic Device (Modification Example)>>

Figure 14A:
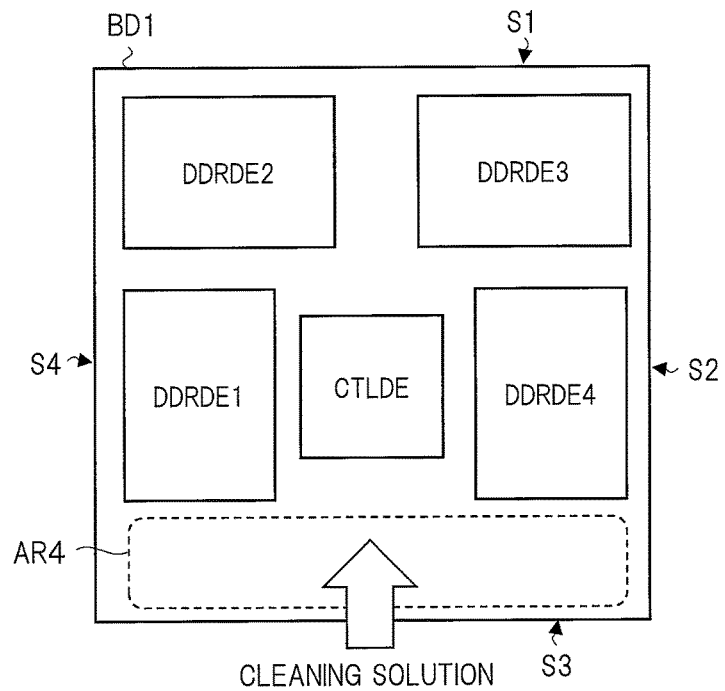
FIGS. 14A and 14B are plan views illustrating schematic configuration examples of outer shapes of an electronic device according to a fifth embodiment of the present invention.
Figure 14B:
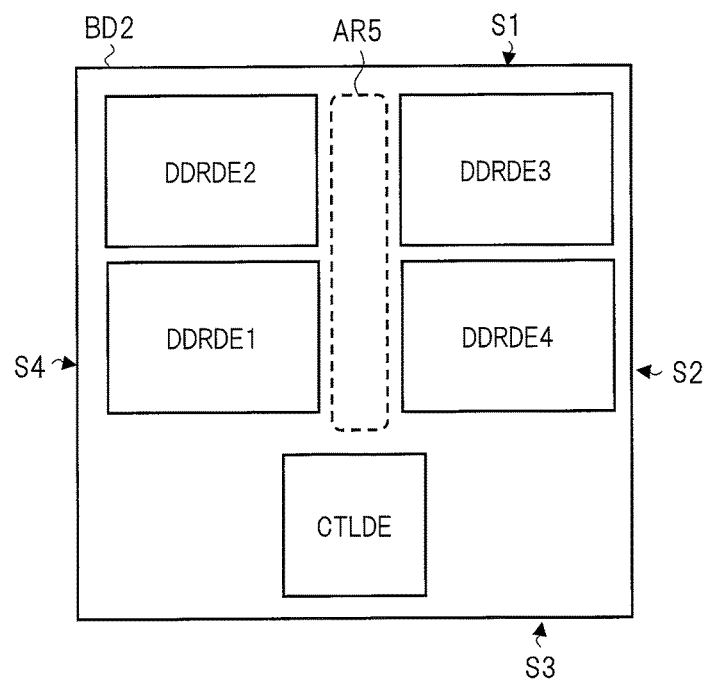

FIGS. 14A and 14B are plan views illustrating schematic configuration examples of outer shapes of an electronic device according to a fifth embodiment of the present invention. The electronic device illustrated in FIGS. 14A and 14B differs from the configuration example illustrated in FIG. 1A, in terms of where a controller device CTLDE and memory devices DDRDE1 to DDRDE4 are mounted on a wiring substrate.

In FIG. 14A, the controller device CTLDE is arranged approximately in the center of a wiring substrate BD1, and the four memory devices DDRDE1 to DDRDE4 are arranged in such a way as to surround one of long sides and two short sides of the controller device CTLDE. The memory devices DDRDE2 and DDRDE3 are arranged side by side along a side S1, and a long side of each of the memory devices DDRDE2 and DDRDE3 is parallel to the side S1. The memory device DDRDE1 is arranged side by side with the memory device DDRDE2 along a side S4, and a long side of the memory device DDRDE1 is parallel to the side S4. The memory device DDRDE4 is arranged side by side with the memory device DDRDE3 along a side S2, and a long side of the memory device DDRDE4 is parallel to the side S2.

In FIG. 14B, the four memory devices DDRDE1 to DDRDE4 are arranged together on the side of a side S1 of a wiring substrate BD2, and the controller device CTLDE is arranged on the side of a side S3. The memory devices DDRDE2 and DDRDE3 are arranged side by side along the side S1, and a long side of each of the memory devices DDRDE2 and DDRDE3 is parallel to the side S1. The memory device DDRDE1 is arranged side by side with the memory device DDRDE2 along a side S4, the memory device DDRDE4 is arranged side by side with the memory device DDRDE3 along a side S2, and a long side of each of the memory devices DDRDE1 and DDRDE4 is parallel to the side S1. The controller device CTLDE is arranged approximately at the center of the side S3.

The electronic device according to the present embodiment is not limited to the arrangement configuration illustrated in FIG. 1A, but may employ the arrangement configuration illustrated in FIGS. 14A and 14B. For example, when the configuration illustrated in FIG. 14A is employed, overlapping of wiring paths between the controller device CTLDE and each of the memory devices DDRDE1 to DDRDE4 is avoidable, and variations in the wiring length are also avoidable. Further, the configuration makes it possible to secure an available space in an area AR4, in which other components can be mounted.

However, in the configuration illustrated in FIG. 14A, the controller device CTLDE is close to each of the memory devices DDRDE1 to DDRDE4. This easily causes undesirable heat circulation, thereby making it difficult to design a heat radiation structure. In addition, in this configuration, it may be difficult to secure flow of a cleaning solution, when flux cleaning is performed after flip-chip bonding of the controller device CTLDE to the wiring substrate BD1. That is, as illustrated in FIG. 14A, when the cleaning solution is poured from the direction of the side S3, the cleaning solution does not easily reach the sides of the controller device CTLDE, each of which opposes the sides S1, S2, and S4.

When the configuration illustrated in FIG. 14B is employed, this makes it easier to design a heat radiation structure, because an area in which the memory devices DDRDE1 to DDRDE4 are mounted is clearly separated from an area in which the controller device CTLDE is mounted. In this configuration, however, there is an area in which wiring paths between the controller device CTLDE and each of the memory devices DDRDE1 to DDRDE4 overlap with each other (an area AR5 in FIG. 14B). Accordingly, in this area, there may be a problem of complicated wiring, and degraded electrical characteristics (signal quality). In addition, since the controller device CTLDE is close to the side S3, it may be difficult to perform the routing of a wiring to be connected to the external terminal PNs illustrated in FIG. 1B, and to secure desirable electrical characteristics.

Meanwhile, when the arrangement configuration illustrated in FIG. 1A is employed, a well-balanced configuration can be obtained, in which the above advantages are utilized while the disadvantages are eliminated. More specifically, in such a configuration, wiring is facilitated, and electrical characteristics (signal quality) are improved, since overlapping of wiring paths between the controller device CTLDE and each of the memory devices DDRDE1 to DDRDE4 is avoidable. Further, the configuration also facilitates design of a heat radiation structure, and sufficiently secures the flow of a flux-cleaning solution. Furthermore, the configuration makes it easier to perform the routing of a wiring to be connected to the external terminal PNs illustrated in FIG. 1B, and to secure desirable electrical characteristics. From the above viewpoints, it is more desirable to use the arrangement configuration illustrated in FIG. 1A, although the arrangement configurations illustrated in FIGS. 14A and 14B are also applicable.

In the foregoing, the invention made by the inventors of the present invention has been concretely described based on the embodiments. However, it is needless to say that the present invention is not limited to the foregoing embodiments and various modifications and alterations can be made within the scope of the present invention. For example, the above embodiments are those described in detail in order to better illustrate the invention and are not intended to be limited to necessarily provide all the configurations described. Part of the configuration of a certain embodiment can be replaced by the configuration of another embodiment, and the configuration of the other embodiment can be added to the configuration of the certain embodiment. Moreover, part of the configuration of the embodiment can be subjected to addition/deletion/replacement of other configurations.

For example, although a LPDDR4 memory device DDRDE is taken as an example here, the present invention is not necessarily limited thereto. The present invention is also applicable to, in particular, any high-speed memory device DDRDE, as with the LPDDR4 memory device DDRDE, to obtain the same effects.

What is claimed is:

1. An electronic device comprising:
   first, second, third, and fourth semiconductor memory devices each of which includes n (n is a natural number) data terminals, and is configured to store data input from the n data terminals;
   a semiconductor device configured to access the data stored in the first, second, third, and fourth semiconductor memory devices; and
   a wiring substrate on which the semiconductor device and the first, second, third, and fourth semiconductor memory devices are mounted, the wiring substrate comprising:
   a first power-supply wiring layer on which the semiconductor device, and the first, second, third, and fourth semiconductor memory devices are mounted, and to which a ground power-supply voltage is supplied;
   a second power-supply wiring layer to which a ground power-supply voltage is supplied; and
   a first wiring layer interposed between the first power-supply wiring layer and the second power-supply wiring layer, and electrically connecting the semiconductor device with m ($0<m<(n\times4)$, m is a natural number) of the ($n\times4$) data terminals included in the first, second, third, and fourth semiconductor memory devices,
   wherein the wiring substrate has a shape of an approximate square defined by a first side, a second side intersecting with the first side, and a third side and a fourth side respectively opposing the first side and the second side,
   wherein the first semiconductor memory device, the second semiconductor memory device, and the third semiconductor memory device are arranged in order along the first side,
   wherein the fourth semiconductor memory device is arranged side by side with the third semiconductor memory device along the second side, and
   wherein the semiconductor device is arranged side by side with the fourth semiconductor memory device along the third side, and also arranged side by side with the first semiconductor memory device or the second semiconductor memory device along the fourth side.

2. The electronic device according to claim 1,
   wherein the first, second, third, and fourth semiconductor memory devices respectively include first, second, third, and fourth control terminals into each of which a command to access the data is input,
   wherein the wiring substrate further comprises:
   a third power-supply wiring layer to which a power supply voltage is supplied; and
   a second wiring layer arranged between the second power-supply wiring layer and the third power-supply wiring layer, electrically connecting the semiconductor device with k ($k=(n\times4)-m$) of the ($n\times4$) data terminals, and electrically connecting the semiconductor device with the first, second, third, and fourth control terminals.

3. The electronic device according to claim 2,
   wherein the semiconductor device includes first, second, third, and fourth external terminal areas to be electrically connected to the first, second, third, and fourth semiconductor memory devices, respectively,
   wherein the first, second, third, and fourth external terminal areas are arranged in order along sides of the semiconductor device,
   wherein each of the first, second, third, and fourth external terminal areas includes:
   a first external terminal group to be connected to (n/2) data terminals;
   a second external terminal group to be connected to corresponding control terminals; and
   a third external terminal group to be connected to (n/2) data terminals, and
   wherein the first external terminal group, the second external terminal group, and the third external terminal group are arranged in order along the sides of the semiconductor device.

* * * * *